United States Patent [19]

Yagi et al.

[11] 4,204,205

[45] May 20, 1980

[54] ELECTRONIC DISPLAY DEVICE

[75] Inventors: Kenjiro Yagi; Hirotomo Hirai, both of Tokyo, Japan

[73] Assignee: Kabushiki Kaisha Daini Seikosha, Japan

[21] Appl. No.: 871,963

[22] Filed: Jan. 24, 1978

Related U.S. Application Data

[63] Continuation-in-part of Ser. No. 653,002, Jan. 28, 1976, abandoned.

[30] Foreign Application Priority Data

Feb. 5, 1975 [JP] Japan ................... 50-15132

[51] Int. Cl.² .............................................. G02F 1/13
[52] U.S. Cl. .................................. 340/719; 340/765; 340/784; 350/343; 361/403
[58] Field of Search ............... 340/324 M, 336, 378 R, 340/718, 719; 58/50 R; 313/220, 493, 514; 174/50.5, 50.51, 50.52, 145; 350/343; 361/403, 413

[56] References Cited

U.S. PATENT DOCUMENTS

| | | | |
|---|---|---|---|
| 3,505,804 | 4/1970 | Hofstein | 58/50 R |
| 3,853,392 | 12/1974 | Fergason | 350/343 |
| 3,861,135 | 1/1975 | Seeger et al. | 58/50 R |
| 3,885,173 | 5/1975 | Lee | 361/403 X |
| 4,008,564 | 2/1977 | Luce et al. | 58/50 R |
| 4,078,855 | 3/1978 | Fujita et al. | 350/343 X |

*Primary Examiner*—David L. Trafton
*Attorney, Agent, or Firm*—Robert E. Burns; Emmanuel J. Lobato; Bruce L. Adams

[57] ABSTRACT

An electronic display device comprises a display panel superposed on a printed circuit board with electrodes being disposed on the facing surfaces of both the display panel and the printed circuit board. An electrically conductive rubber connector electrically interconnects the electrodes in a predetermined pattern. The rubber connector is electrically conductive only in the direction normal to the electrodes and is non-conductive in the transverse direction thereby preventing short-circuiting between the electrodes. The connector is comprised of alternate segments of electrically conductive rubber and electrically non-conductive rubber alternately disposed along the transverse direction and each extending in the direction normal to the electrodes between the electrodes for electrically connecting opposed ones of the electrodes on the facing major surface of the display panel and the printed circuit board.

7 Claims, 4 Drawing Figures

ELECTRONIC DISPLAY DEVICE

RELATED APPLICATIONS

This is a Continuation-in-part application of the prior copending application Ser. No. 653,002 filed Jan. 28, 1976 and now abandoned.

BACKGROUND OF THE INVENTION

This invention relates to an electronic display device, and more particularly to a connecting device interposed between a display panel and an electronic circuit mounted on a printed circuit board in said electronic display device.

In a conventional connecting device of this kind, as shown in FIG. 1, a set of connections 1 comprised of electrically conductive rubber 1a are introduced in the hollow interior of an insulated frame by means of injection molding and the connectors are interposed between opposite electrodes 2a and 3a which are respectively mounted on the upper surface of a printed circuit board 2 and on the lower surface of a display panel 3 for establishing electric connection between the display panel and the electronic circuitry of the printed circuit board.

However, there are drawbacks in the conventional connecting device. For example, there arises a shift in position of the conductive rubber 1a relative to the respective electrodes 2a and 3a thereby causing an electric short between the connector and each adjacent electrode and a conductive fault therebetween. Further, during assembly of the connector, since the conductive rubber has to be introduced into the insulated frame after molding of the frame, the production cost is somewhat expensive.

An alternative means of electrically connecting a display panel and a printed circuit board in a display device is disclosed in U.S. Pat. No. 3,910,029 issued Oct. 7, 1975. In this device the display panel and printed circuit board are separated by a base, and respective electrodes on the display panel and printed circuit board are connected by metallic strips extending through the base. The resulting structure is complex.

It is therefore an object of the present invention to eliminate the above-mentioned drawbacks and to provide an improved type connecting device of an electronic display device.

DETAILED DESCRIPTION OF THE INVENTION

Figure 1:
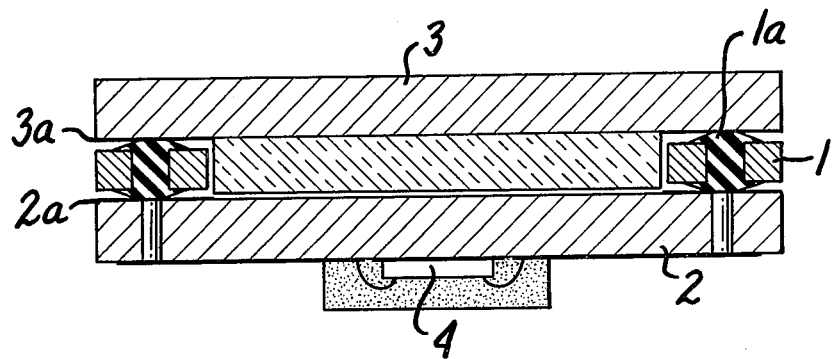
FIG. 1 is a longitudinal sectional view showing an embodiment of a conventional type display device.
Figure 2:
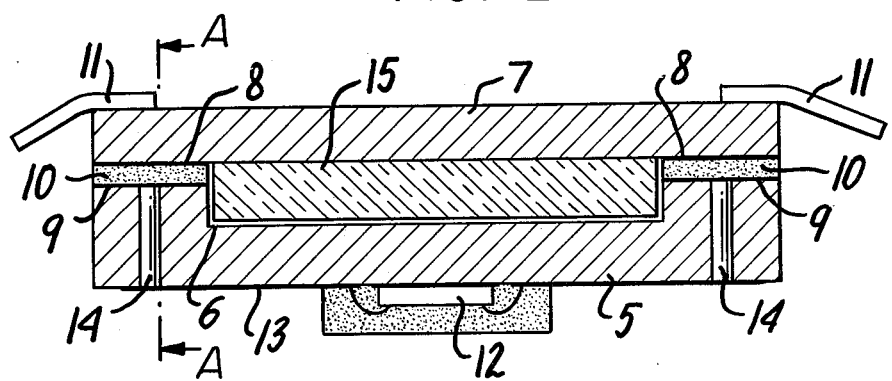
FIG. 2 is a longitudinal sectional view showing an embodiment of a display device according to the present invention.
Figure 3:
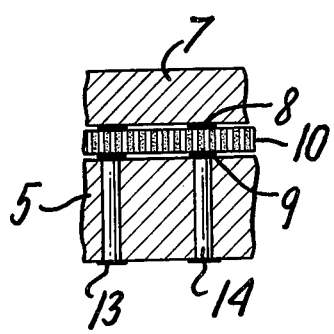
FIG. 3 is a sectional view taken along on a line A—A of FIG. 2.

Referring to FIGS. 2 and 3, there is shown an embodiment of the present invention. A printed circuit board 5 is provided with cut-out or recessed portion 6 in which is disposed a transparent glass 15 serving as a reflective means. A display panel 7 using an optical element (such as a liquid crystal panel) is disposed in such a way that it faces the recessed portion 6 of the printed circuit board. A connector 10 comprised of an electrically conductive rubber is interposed between an external electrode 8 which is mounted on the lower face of the display panel and an opposed electrode 9 mounted on the upper face of the printed circuit board 5. The connector 10 is constructed so as to be electrically conductive in only one direction and as shown in FIGS. 2 and 3, the connector is conductive only in the vertical direction, i.e. the direction normal to the electrodes 8 and 9 and is not conductive in the horizontal or transverse direction thereby preventing short-circuiting between the electrodes. A pressing tool 11 is used to tightly press and assemble these members together.

An intergrated circuit or IC 12 is connected by wire bonding to a pattern of electrodes 13 mounted on the lower face of the printed circuit board 5. The IC 12 is further connected to the electrode 9 through a set of electrodes 14 extending through holes formed in the printed circuit board 5.

Figure 4:
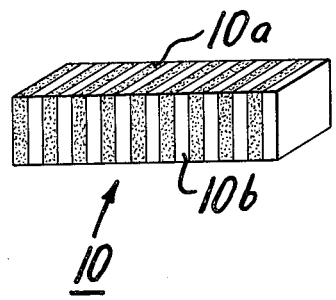
FIG. 4 is a perspective view of the connector for connecting a display panel and a printed circuit board in the display device according to the present invention.

A section of the connector 10 is illustrated in FIG. 4. The connector 10 is comprised of alternate electrically conductive sections 10a and electrically non-conductive sections 10b which extend in the vertical direction from the top surface to the bottom surface of the connector 10. Therefore, each conductive section 10a establishes an electrically conductive path in the vertical direction of the connector 10. But because the conductive sections 10a and the non-conductive sections 10b alternate along the transverse direction of the connector 10 no electrically conductive path exists in that direction for a distance greater than the thickness of an electrically conductive segment 10a. When the connector 10 is disposed between the lower face of the display panel 7 and the upper face of the printed circuit board 5, the electrically conductive portions 10a of the connector 10 define electrically conductive paths in the vertical direction between the lower face of the display panel 7 and the upper face of the printed circuit board 5. Thus, electrically conductive paths are established between respective electrodes 8 and 9.

As shown in FIG. 3, the spacing between successive conductive segments 10a of the connector 10 which is defined by the thickness of the non-conductive segments 10b is much less than the spacing between adjacent electrodes 8 on the lower surface of the display panel 7 and the spacing between adjacent electrodes 9 on the upper surface of the printed circuit board 5. Therefore, a shift in position of the connector 10 cannot cause short circuiting between adjacent ones of the electrodes 8 or 9. In addition, electrical connection between opposed pairs of the electrodes 8 and 9 is ensured because of the narrow spacing between successive conductive segments 10a of the connector 10 so that a shift in position of the connector 10 cannot open an electrical connection between any electrode 8 and opposed electrode 9. Therefore, the connector 10 provides a stable and reliable interconnection between the electrodes on the bottom of the display panel 7 and the electrodes on the top of the circuit board 5.

A suitable material for the connector 10 is silicon rubber. The electrically conductive segments 10a are comprised of the silicon rubber having electrically conductive particles dispersed throughout in sufficient number to define electrically conductive paths through each of the conductive segments 10a, while the electrically non-conductive segments 10b are free of the electrically conductive particles. Carbon or silver grains are suitable electrically conductive particles.

It is to be noted that the electrically conductive rubber serves as the connector which electrically connects only between the opposed electrodes 8 and 9, as shown in FIG. 3.

As mentioned above, the connecting device according to the present invention brings about many advantages. For example, it is possible to avoid electrical short-circuiting occuring between the connector 10 and the adjacent electrodes due to a shift in position of the connection; and it assures electrical connection between both the electrodes of the display panel 7 and the printed circuit board 5. Further, since the distance between the opposed electrodes is very small, the connector 10 of the present invention is very useful in a small sized display device such as in a watch or the like or in a display device having a high display content. Dimensions of a typical connector 10 are a width of 2 mm. and a thickness of 0.5 mm. The length will of course depend on the size of the display device, but 15 mm. is representative. The connector 10 may typically have about fifteen conductive segments per centimeter. Furthermore, it is easy to produce the connector on a large scale only by a punching operation so that the cost of production is decreased.

In addition, it can be appreciated that the recessed portion 6 of the printed circuit board can be replaced by an aperture which faces the display device.

What we claim is:

1. An electronic display device comprising: a display panel having front and rear major surfaces; a printed circuit board superposed beneath and spaced apart from the rear surface of said display panel; electrodes on the spaced-apart and facing major surfaces of said display panel and printed circuit board, wherein said electrodes on said rear major surface of said display panel have a certain width dimension and said electrodes on said facing major surface of said printed circuit board having a certain width dimension; a connector comprised of alternate segments of electrically conductive rubber and electrically non-conductive rubber alternately adjacently disposed along the width dimensions of said electrodes and extending in the direction normal to said electrodes between said electrodes for electrically connecting opposed ones of said electrodes on said facing major surfaces of said display panel and said printed circuit board, wherein said alternate segments of conductive and non-conductive rubber have a width dimension in the direction of the electrode width dimensions substantially less than the electrode width dimensions; and electronic circuitry mounted on said printed circuit board and being electrically connected to said electrodes for driving said display panel.

2. An electronic display device according to claim 1; wherein said electronic circuitry includes an integrated circuit mounted on the other major surface of said printed circuit board not facing said display panel.

3. An electronic display device according to claim 1; wherein said printed circuit board has a recessed portion facing the display panel rear surface; and a layer of reflective glass connected to said display panel rear surface and lying within said recessed portion.

4. An electronic display device according to claim 1; wherein said segments of electrically conductive rubber are comprised of silicon rubber having dispersed therein conductive particles.

5. An electronic display device according to claim 4; wherein said conductive particles are carbon.

6. An electronic display device according to claim 4; wherein said conductive particles are silver.

7. An electronic display device according to claim 1; wherein said segments of electrically non-conductive rubber are comprised of silicon rubber substantially free of conductive material.

* * * * *